(12) United States Patent
Lo et al.

(10) Patent No.: US 6,252,705 B1
(45) Date of Patent: Jun. 26, 2001

(54) STAGE FOR CHARGED PARTICLE MICROSCOPY SYSTEM

(75) Inventors: Chiwoei Wayne Lo, Campbell; Daniel N. Bui, Castro Valley, both of CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/318,400

(22) Filed: May 25, 1999

(51) Int. Cl.[7] ............................. G02B 21/26; G02B 21/00
(52) U.S. Cl. .......................... 359/393; 359/391; 359/394; 359/383
(58) Field of Search .......................... 359/368, 391–398; 250/308–312, 397, 548, 559.3, 440.11, 441.11, 442.11; 355/53, 72; 356/399–40.1

(56) References Cited

U.S. PATENT DOCUMENTS

| | | | |
|---|---|---|---|
| 3,745,341 | * 7/1973 | Sakitani | 250/442.11 |
| 4,447,731 | * 5/1984 | Kuni et al. | 250/310 |
| 4,627,009 | * 12/1986 | Holmes et al. | 359/392 |
| 5,149,967 | * 9/1992 | Otaka | 250/310 |
| 5,214,290 | * 5/1993 | Sakai | 250/442.11 |
| 5,895,915 | * 4/1999 | DeWeerd et al. | 359/393 |

\* cited by examiner

Primary Examiner—Thong Nguyen
(74) Attorney, Agent, or Firm—Skjerven Morrill MacPherson LLP (57) ABSTRACT

A stage assembly for holding a work-piece in a charged particle microscopy system includes a magnetic motor (e.g., brushless linear servo motor) for driving an X-platform riding on a base along the X axis, a non-magnetic linear motor (e.g., piezoelectric motor) for driving a Y-platform riding on the X-platform along the Y axis, and a non-magnetic rotary motor (e.g., piezoelectric motor) for rotating a rotary platform over the Y-platform, wherein the duty cycle of the magnetic motor is substantially greater than the duty cycle of the non-magnetic linear and rotary motors. This along with the particular arrangement of the motors and the platforms yields a compact, durable, and vacuum compatible stage which has minimal mechanical vibrations, minimal interference with the charged particle microscope, minimal particle generation, and high speed area coverage.

46 Claims, 9 Drawing Sheets

STAGE FOR CHARGED PARTICLE MICROSCOPY SYSTEM

BACKGROUND OF THE INVENTION

1. Field of the Invention

The present invention relates to charged particle systems, and more particularly to a stage suitable for use in a charged particle system.

2. Description of Related Art

As the critical dimensions of micro-electronic circuits continue to shrink, accuracy of existing optics-based systems in performing such tasks as identifying defects in patterned substrates (e.g., semiconductor wafers, or optical masks) and measuring critical dimensions (e.g., metal line width, contact hole size) declines. For this reason, charged particle microscopy systems, such as charged particle beam (e.g., electron or ion) systems, with their high imaging resolution have gained popularity.

A charged particle microscopy system typically includes a stage moving in two dimensions (X-Y plane) which aims to fulfill these requirements: (i) high mean time before failure (MTBF), (ii) high speed area coverage, (iii) low mechanical vibrations during travel, (iv) high vacuum (1E-6 torr or less) compatibility, (v) minimal interference (from active or passive, static or alternating sources) with the charged particle microscope (lens and beam), (vi) low particle generation, and (vii) a compact structure.

A high MTBF (MTBF is a measure of durability) of the stage is important considering the large volume of wafers moving through a fabrication facility, the number of process steps at which wafer inspection and CD measurements are required, and the relatively small field of view of the microscope's optics column. These considerations also make high speed area coverage essential in achieving a reasonable throughput. Low mechanical vibration is a prerequisite to accurate measurement by the charged particle microscope where, for example, wafer inspection is carried out while the stage is moving (i.e., the magnitude of the stage vibration must be less than the feature size resolvable by the charged particle microscope). High vacuum compatibility is required because in a charged particle beam system the beam cannot travel through air, thus requiring a vacuum environment. The interference with the charged particle microscope from passive or active, static or alternating sources needs to be minimized to ensure high resolution imaging and precision positioning of the beam. Contamination of wafers due to particles generated by the stage must be kept at a minimum to allow the use of the system in-line in the fabrication facility. Lastly, a stage having a compact structure reduces system foot-print. This is particularly important if the system is to be used in a clean room, since the cost of maintaining a clean room is typically proportional to its size. Also, a smaller stage can be housed in a smaller vacuum chamber which is quicker to pump down to the required vacuum.

The X and Y platforms of a stage are typically driven by either magnetic motors (e.g., linear brushless servo motors) or non-magnetic motors (e.g., piezoelectric motors). Because the fixed and moving components of a brushless magnetic motor do not contact one another during operation, both vibration and particle generation by this type of motor are minimal, and its endurance is increased (no wear and tear). These characteristics along with a magnetic motor's high speed and high torque make it a suitable candidate for driving the X and Y platforms. However, magnetic motors contain strong magnets and have a high permeability housing which can severely interfere with the charged particle microscope optics and beam positioning.

Non-magnetic motors do not contain magnetic materials, and are commonly used for precision stage positioning. However, because the fixed and moving components of non-magnetic motors contact one another during operation, they have lower endurance, more vibration, and more particle generation than magnetic motors. Also, non-magnetic motors are generally slower speed and have less torque than magnetic motors.

Figure 1A:
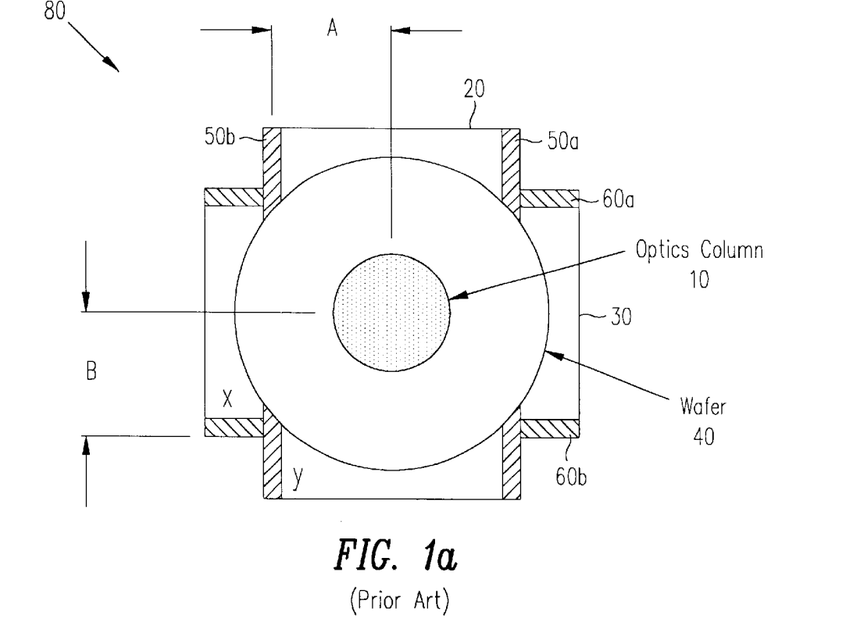
FIGS. 1a and 1b show a top (plan) view of a prior art simplified stage with magnetic motors driving the X and Y platforms, wherein the center and left edge of a wafer are positioned under an optics column in FIGS. 1a and 1b, respectively.
Figure 1B:
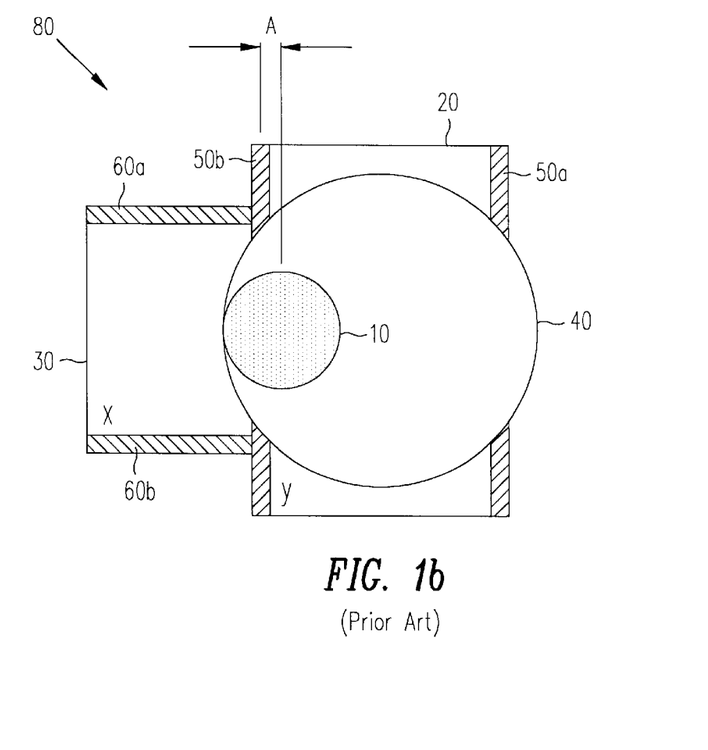

FIGS. 1a and 1b show the top (plan) view of a simplified stage 80 which uses magnetic motors to drive both X platform 30 and Y platform 20 (which are stacked). The magnetic motors are located along the edges of the platforms, and are indicated by cross-hatched areas 50a, 50b, 60a, and 60b. In FIG. 1a, the center of a wafer 40 is positioned under a charged particle microscope optics column 10. As indicated by the distances marked as A and B, column 10 is well separated from magnetic motors 50a/b and 60a/b. Therefore, the interference by magnetic motors 50a/b and 60a/b with column 10 is minimal.

However, when the left or right edges of wafer 40 are positioned under column 10 as in FIG. 1b, the distance between column 10 and one of motors 50a/b becomes much shorter (as indicated by the distance marked A). Because of the close proximity of motor 50b with column 10, the magnetic material (e.g., magnet assemblies and magnetic shield of the motor) and electro-magnetic field (e.g., motor coils) of motor 50b interfere with column 10.

The interference from the magnetic motors 50a/b can be reduced by using a wider platform 20 whereby distance A is increased. However, this results in a larger and heavier platform 20 which requires larger motors for driving both platforms 20 and 30. This undermines achieving mechanical precision and the above seven requirements for a stage.

Using non-magnetic motors to drive the X and Y platforms eliminates the interference problem, but causes other inhibiting problems such as mechanical vibration, particle generation, slow area coverage, and low endurance.

Given the shortcomings of each of the magnetic and non-magnetic motors, a stage for use in a charged particle microscopy system is needed which fulfills at least the above-mentioned seven requirements.

SUMMARY

In accordance with the invention, a stage suitable for use in a charged particle microscopy system (but not so limited) integrates a magnetic motor and a non-magnetic motor such that: (i) high mean time before failure (MTBF) is achieved, (ii) high speed area coverage is achieved, (iii) mechanical vibrations during travel are minimized, (iv) the stage is high vacuum compatible; (v) interference with the charged particle microscope is minimized, (vi) particle generation is minimized, and (vii) a compact structure is obtained.

The magnetic motor drives the stage along a first axis, and the non-magnetic motor drives the stage along a second axis. In one embodiment, an operational duty cycle of the magnetic motor is substantially greater than the operational duty cycle of the non-magnetic motor.

In another embodiment, the magnetic motor is a brushless linear servo motor, and the non-magnetic motor is a linear piezoelectric motor.

In another embodiment, a constant distance is maintained between the magnetic motor and a microscope located to observe a work-piece on the stage.

In another embodiment, a non-magnetic rotary motor provides rotary motion, wherein an operational duty cycle of the magnetic motor is substantially greater than the operational duty cycle of the non-magnetic rotary motor.

In another embodiment, the magnetic motor, the non-magnetic motor, the non-magnetic rotary motor, and the stage are vacuum compatible.

In another embodiment, the stage includes a first platform which is coupled to the magnetic motor and is movable on a base along the first axis, a second platform which is coupled to the non-magnetic motor and is movable on the first platform along the second axis.

In another embodiment, a rotary table is coupled to the non-magnetic rotary motor and is capable of rotating on the second platform. A microscope is fixed to the base and is located to observe a work-piece on the stage.

In another embodiment, the non-magnetic motor is fixed to the first platform and is enclosed by the first and second platforms. The magnetic motor includes a magnet track assembly which is fixed to the base and defines an opening for receiving a coil assembly, the opening facing away from the microscope.

In another embodiment, the stage includes a first linear bearing rail to allow the first platform to move on the base, a second linear bearing rail to allow the second platform to move on the first platform, and a rotary bearing to allow the rotary table to rotate on the second platform. A constant distance is maintained between the first linear bearing rail and the microscope. In another embodiment, the first linear bearing rail is from hardened steel, and the second linear and rotary bearings are from hardened beryllium copper. The first platform, the second platform, and the rotary table are from aluminum.

In another embodiment, the stage includes another non-magnetic motor coupled to the stage to adjust the distance between the work-piece and the microscope.

In accordance with the invention, a method of operating a stage includes the acts of: driving the stage along a first axis by a magnetic motor, and driving the stage along a second axis by a non-magnetic motor. In one embodiment, an operational duty cycle of the magnetic motor is substantially greater than the operational duty cycle of the non-magnetic motor.

Another embodiment includes the acts of: locating a work-piece on the stage under a microscope, moving an area of the work-piece to be inspected to within the field of view of the microscope during the duty cycle of the non-magnetic motor, and inspecting the area of the work-piece during the duty cycle of the magnetic motor. In another embodiment, the area includes a strip of the work-piece, a width of the strip being defined by the field of view of the microscope.

Another embodiment includes the acts of: locating a work-piece on the stage under a microscope, rotating the work-piece so that two areas of the work-piece become parallel to the first axis, and comparing corresponding sub-areas in the two areas to one another. In another embodiment, the comparing act includes: acquiring a first data from a sub-area of the first area, moving to a corresponding sub-area of the second area during the duty cycle of the magnetic motor, acquiring a second data from the sub-area of the second area, and comparing the first and second data. In another embodiment, the acquiring acts include: moving a strip of a sub-area to within the field of view of the microscope during the duty cycle of the non-magnetic motor, and acquiring data from the strip during the duty cycle of the magnetic motor, wherein a width of the strip is defined by the field of view of the microscope. In another embodiment, the rotating act is performed by a non-magnetic rotary motor, the operational duty cycle of the magnetic motor being substantially greater than the operational duty cycle of the non-magnetic rotary motor.

The above-mentioned and other features and advantages of the invention will become more apparent from the following description and the accompanying drawings.

BRIEF DESCRIPTION OF THE DRAWINGS

The present invention may be better understood, and its numerous objects, features, and advantages made apparent to those skilled in the art by referencing the accompanying drawings.

FIGS. 7a and 7b are top views of a wafer in which two dies are shown.

The use of the same reference symbols in different drawings indicates similar or identical items.

DESCRIPTION OF PREFERRED EMBODIMENTS

In accordance with the present invention, a stage which is suitable for use in a charged particle microscopy system (e.g., for wafer and optical mask inspections, and CD and waveform measurements) integrates a magnetic motor and a non-magnetic motor.

Figure 2:
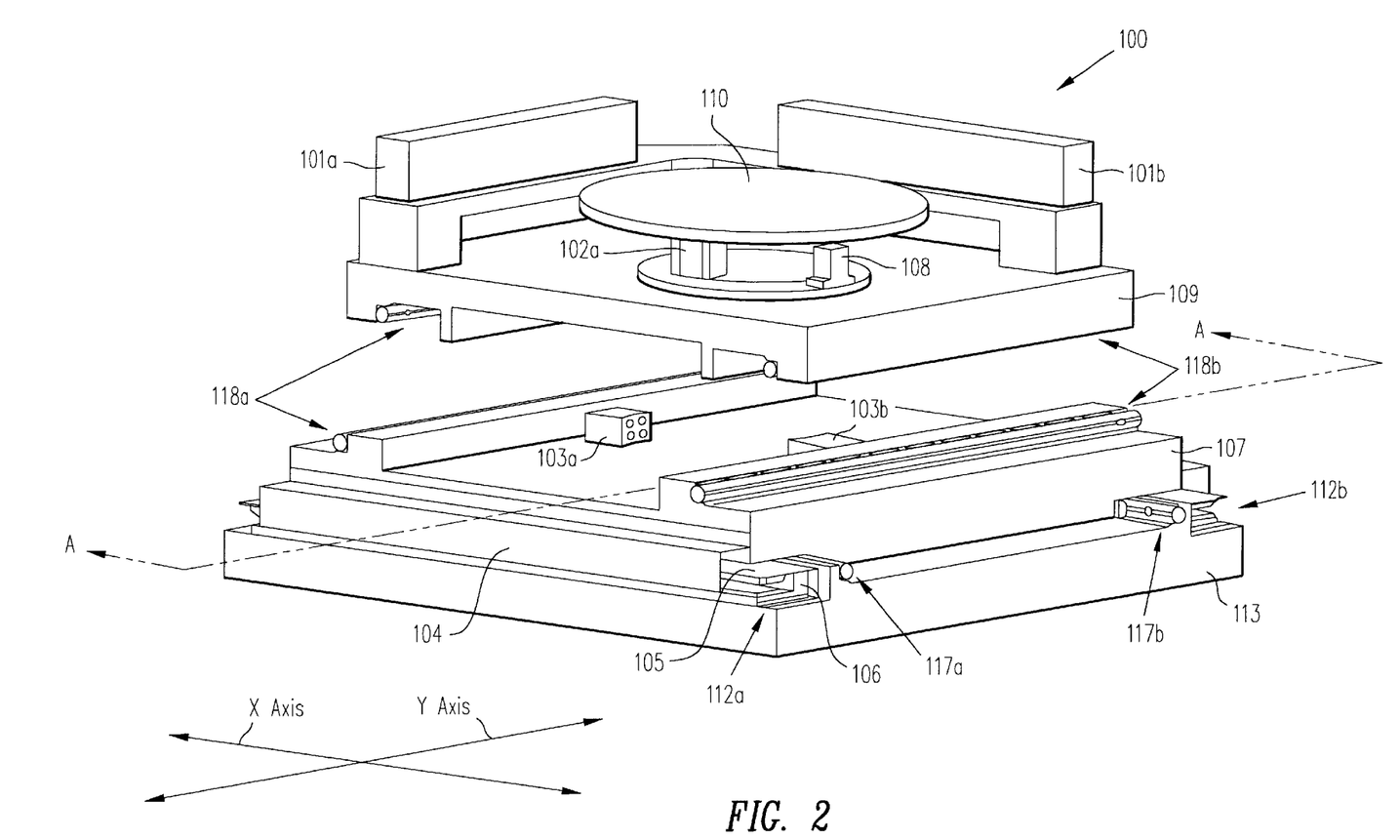
FIG. 2 shows a stage for use in a charged particle microscopy system in accordance with one embodiment of the present invention.

FIG. 2 shows a stage 100 in accordance with an embodiment of the invention. Stage 100 includes a first platform 107 (hereinafter referred to as the fast platform) mounted on top of a stationary base 113, a second platform 109 (hereinafter referred to as the slow platform) mounted on top of fast platform 107 (slow platform 109 is shown to be above but not in contact with fast platform 107 to expose the inside of stage 100), a rotary table 110 mounted on top of slow platform 109, and a wafer chuck (not shown) for holding a wafer in place is mounted on top of rotary table 110. An electron beam microscope (not shown), such as a scanning electron beam or a projection electron beam microscope, is positioned over rotary table 110, and is rigidly connected to base 113.

Fast platform 107 moves over base 113 along an axis indicated in FIG. 2 as the X axis. Slow platform 109 moves over fast platform 107 along an axis indicated in FIG. 2 as the Y axis, the Y axis being perpendicular to the X axis. Rotary table 110 is capable of rotating over the slow platform 107.

Two vacuum compatible magnetic motors 112a and 112b are located on opposite sides of base 113, and drive fast platform 107. Linear bearing rails 117a and 117b are adjacent motors 112a/b, and allow platform 107 to slide over base 113 along the X axis.

Each of motors 112a/b conventionally includes a coil moving along a track of magnets. In one embodiment, vacuum compatible brushless linear servo motors (such as the commercially available LA-S-1-P motor from Anorad Corp., or ATS3400 motor from Aerotech) are used as motors 112a/b, although other types of magnetic motors may also be used.

Two vacuum compatible non-magnetic motors 103a and 103b are located on opposite sides of platform 107, and drive slow platform 109. Linear bearing rails 118a and 118b are adjacent motors 103a/b, and allow platform 109 to slide over platform 107 along the Y axis.

In one embodiment, vacuum compatible piezoelectric linear motors, such as the commercially available SP-8V motor from Anorad Corp. (wherein motion is created by a series of PZT (Lead-Zirconate-Titanate) elements actuating a ceramic "fingertip" against a hard work surface), or vacuum compatible Inchworm motors from Burleigh Instruments Inc. (wherein motion is created through sequential activation of three PZT elements coupled to an output shaft), or vacuum compatible MPSL-104 motor from Micro Plus Systems Inc., are used as motors 103a/b. Also, other piezoelectric motors such as the commercially available vacuum compatible Picometer motor from New Focus Inc. which uses rotary action along with a lead screw to achieve linear motion may be used.

Two vacuum compatible non-magnetic rotary motors are located on opposite sides of rotary table 110, and drive rotary table 110 (only one motor 102a of the two non-magnetic motors is visible, the second one being located behind rotary table 110 directly opposite motor 102a). A rotary bearing (not shown) perpendicular to the surface of rotary table 110 is in the center of rotary table 110, allowing table 110 to rotate over platform 109.

All of the above-mentioned types of piezoelectric motors, other than the Inchworm motor, can be adapted to provide rotary motion, and thus can be used as the rotary motors driving table 110.

Two interferometer mirrors 101a and 101b are used conventionally to track the position of respective platforms 109 and 107 when in motion. Optical encoder 108 tracks the position of the rotary table 110 when in motion.

Together, fast platform 107 and slow platform 109 can move any part of a work-piece (e.g., a wafer) on table 110 to within the field of view of the charged particle microscope. Rotary table 110 is used to re-orient the work-piece during such operations as inspection of the work-piece, and to align the work-piece to the X or Y axis, for example by aligning the horizontal or vertical edge of the dies on a wafer to the X or Y axis. Generally, the wafer should be aligned to the axis along which wafer inspections or measurements are mostly carried out. This is particularly important when the motion of platforms 107 and 109 are not perfectly perpendicular to one another (e.g., due to the platforms 107 and 109 falling out of mechanical alignment). In one embodiment, wafer inspection is mostly carried out along the X axis, and thus the wafer is aligned to the X axis.

Non-magnetic motors 103a/b are placed inside stage 100 (i.e., are enclosed by platforms 107 and 109 as shown in FIG. 2) instead of being mounted on the outside of the stage as is conventionally done. This greatly reduces wafer contamination since platforms 107 and 109 help block particles generated by operation of these motors from reaching the wafer. In addition, platforms 107 and 109 serve as electric shields around the motors, preventing any interference by the AC voltage powering motors 103a/b.

Figure 3:
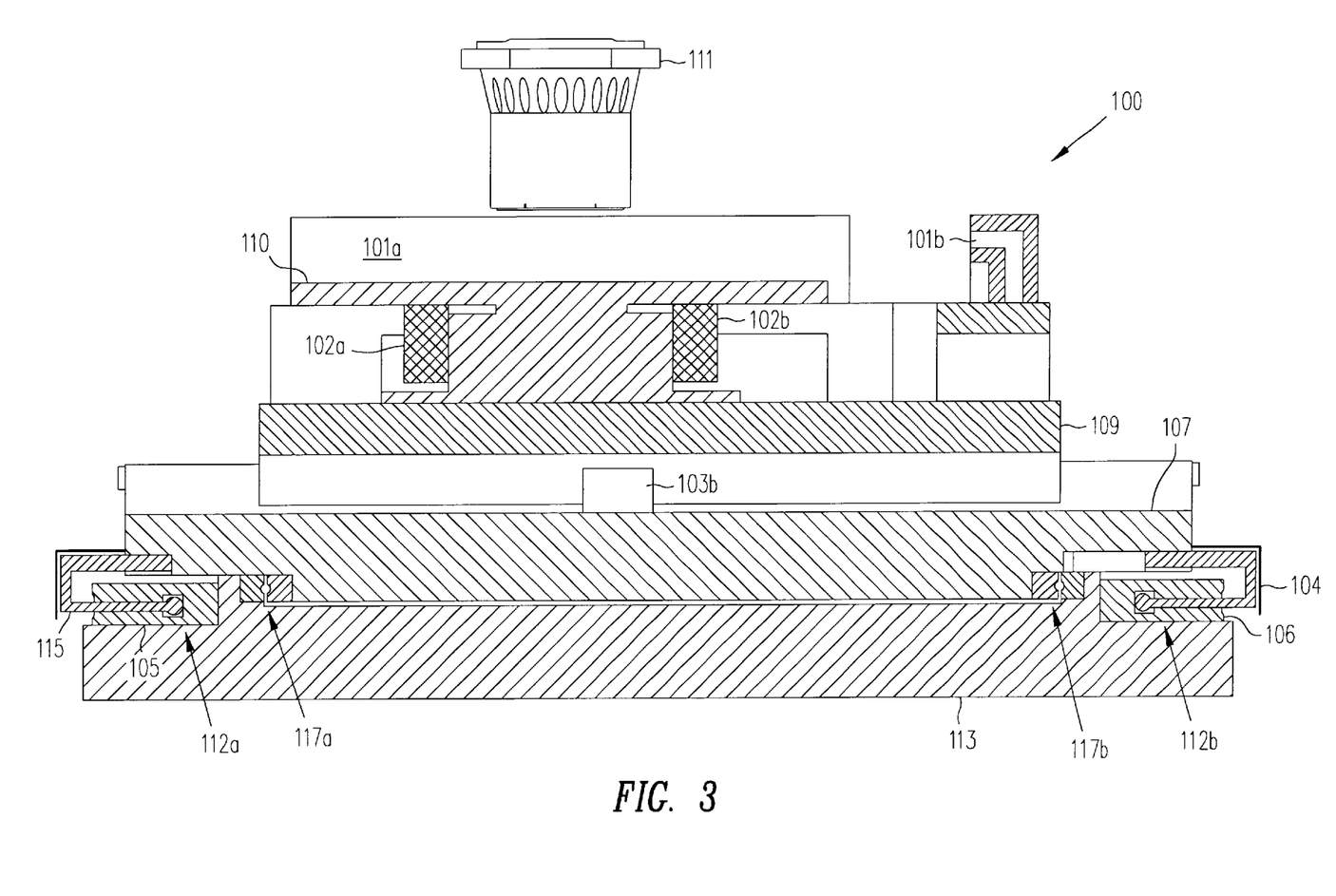
FIG. 3 is a cross section view along A—A of the stage of FIG. 2.

FIG. 3 is a cross section view along A—A of stage 100 of FIG. 2. An objective lens 111 of the electron beam microscope positioned directly over rotary table 110 is also shown. The magnetic motors 112a/b are integrated into stage 100 such that their interference with objective lens 111 (both the lens and the beam) is minimized. Each of magnetic motors 112a/b includes a magnet track assembly 106 enclosed by a housing 105, and a cooperating motor coil assembly 115 covered by a coil shield 104.

Unlike conventional designs wherein the motor coil assembly is stationary and the magnet track assembly moves, magnet track assembly 106 along with its housing 105 are bolted to base 113, and are thereby stationary. If motor magnet track assembly 106 with its array of strong magnets were allowed to move, the magnetic field strength at the beam position would fluctuate and induce beam drift. Also, a moving housing 105 can interfere with the optical properties of a magnetic objective lens, especially the immersion type lens that spills a strong magnetic field over the stage. Note that magnet track assembly 106 is bolted to base 113 such that its end opening, which receives motor coil assembly 115, points away from objective lens 111, thereby reducing its magnetic field interference with the beam.

Fast platform 107 is connected to motor coil assembly 115, and thus the movement of fast platform 107 is restricted to along the axis orthogonal to the FIG. 3 plane (X axis in FIG. 2). Fast platform 107 carries slow platform 109, rotary table 110, and the wafer chuck (not shown). The movement of slow platform 109 is along the axis parallel to the FIG. 3 plane (Y axis in FIG. 2).

Figure 4:
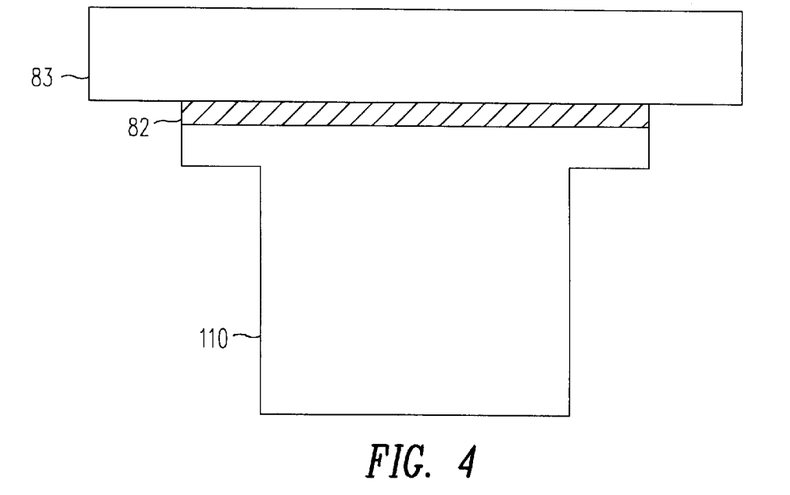
FIG. 4 shows the rotary table portion of FIG. 3 adapted to enable Z motion.

The stage 100 of FIGS. 2 and 3 may be adapted for Z axis motion as shown in FIG. 4. Z axis motion allows the distance between a work-piece (e.g., a wafer) on the rotary table 110 (FIG. 3) and the microscope 111 (FIG. 3) to be adjusted. In FIG. 4, a Z (tilt) platform 82 is positioned between a wafer chuck 83 and rotary table 110. A non-magnetic motor (not shown) is positioned between platform 82 and rotary table 110, and causes platform 82 to move along the Z axis relative to rotary table 110. Vacuum compatible piezoelectric motors, such as commercially available P-740 and P-741 from Physik Instrumente (PI) Gmbh Co., may be used (motors P-740 and P-741 have compact Z dimensions and thus can easily be integrated into stage 100). During stage motion, Z platform 82 can continually adjust to maintain a constant working distance between the microscope and the working piece so that wafer imaging is always in focus.

Figure 5A:
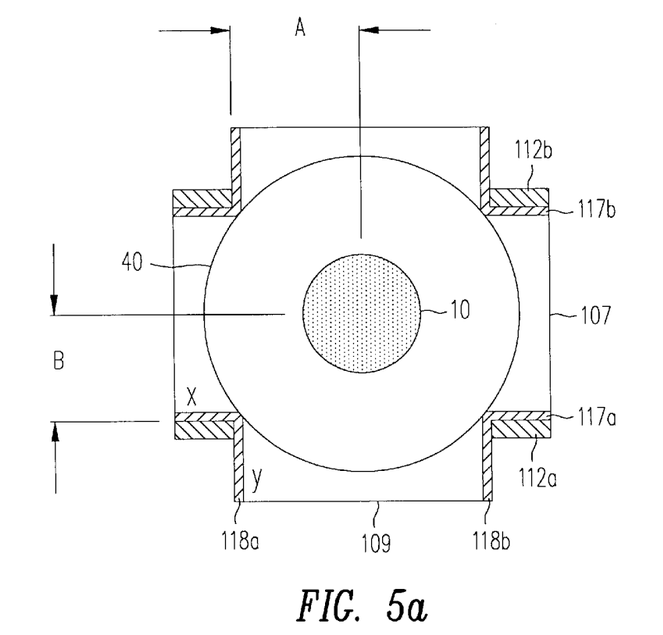
FIGS. 5a, 5b, and 5c show a simplified top (plan) view of the stage of FIG. 2 wherein the center, left edge, and bottom edge of the wafer are positioned under the optics column in FIGS. 5a, 5b, and 5c, respectively.
Figure 5B:
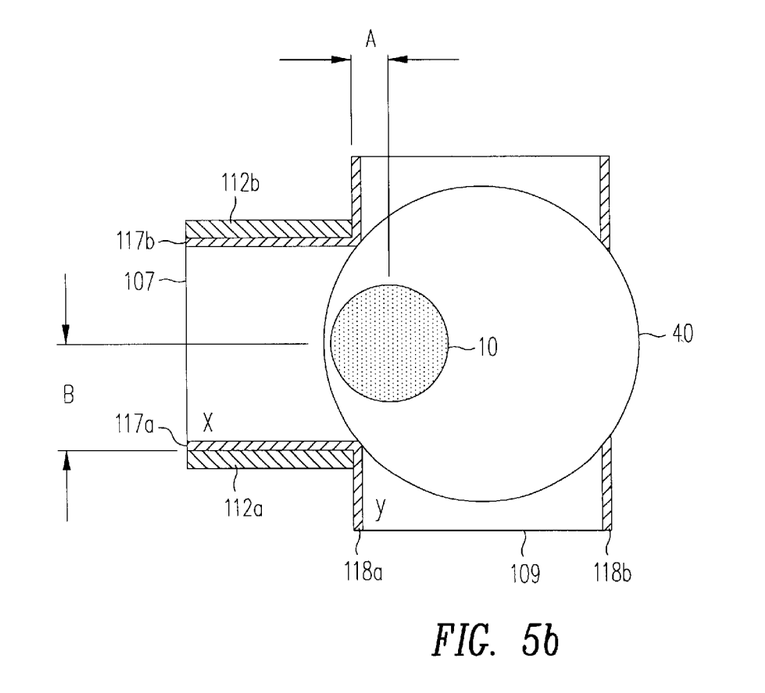
Figure 5C:
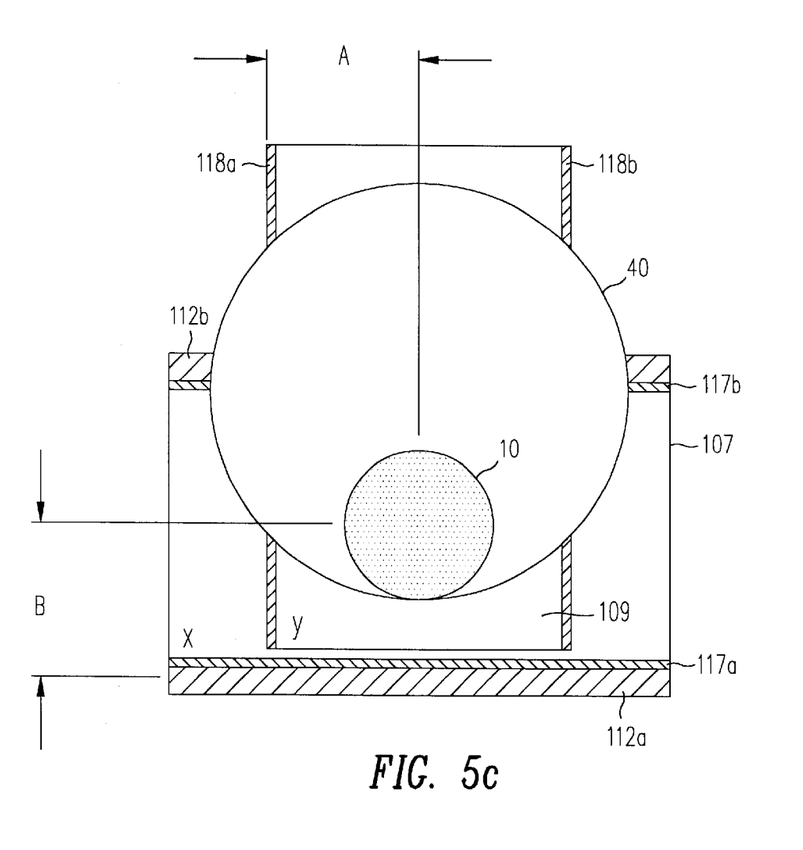

FIGS. 5a, 5b, and 5c show a simplified top (plan) view of stage 100 of FIG. 2, wherein the center, the left edge, and the bottom edge of wafer 40 are positioned under a charged particle microscope optics column 10, respectively. Wafer 40 is moved along the horizontal direction (X axis) by magnetic motor driven fast platform 107, and along the vertical direction (Y axis) by non-magnetic motor driven slow platform 109. Magnetic motors 112a/b and linear bearing rails 117a/b are located along the bottom and top edges of platform 107, respectively, and non-magnetic motors 103a/b (not shown) and linear bearing rails 118a/b are located at the left and right edges of platform 109 respectively.

As indicated by the distance B in FIGS. 5a, 5b and 5c, magnetic motors 112a/b and rails 117a/b are well separated from column 10 at all times (i.e., a fixed distance B is maintained between column 10 and motors 112a/b and rails 117a/b regardless of what area of wafer 40 is positioned under column 10). Therefore, any interference from magnetic motors 112a/b and rails 117a/b with column 10 is minimized. This enables use of such high permeability and durable material as hardened steel for bearing rails 117a/b.

However, non-magnetic motors 103a/b and rails 118a/b come into close proximity to column 10 when platform 109 is moved to either of its extreme positions. This is illustrated in FIG. 5b wherein, as indicated by distance A, column 10 is in close proximity to the motor located at the left edge of platform 109 and bearing rail 118a. However, this raises no concerns since the motors driving platform 109 neither have magnetic material nor generate magnetic field, and thus do not interfere with column 10. Also, rails 118a/b are made of low permeability and non-magnetic material in order to minimize any interference by rails 118a/b. (Note that because distance A need not be made larger, a smaller platform 20 is obtained which helps achieve a compact stage.)

Rails 118a/b have mirror finished surface to minimize vibrations, have a hard surface to minimize wear and tear at the point of contact, and are made from relatively strong material resistant to deforming or breaking. In a preferred embodiment, rails 118a/b are hardened beryllium copper (beryllium copper is heat treated to achieve the requisite hardness). Other material such as ceramic, phosphor bronze, and some types of non-magnetic steel alloys (e.g., inconel, or elgiloy) can also be used.

In FIG. 5c, wafer 40 is positioned such that the bottom edge of wafer 40 is beneath column 10. As discussed above, the distance B between column 10 and magnetic motors 112a/b and rails 117a/b remains fixed. The distance A between column 10 and non-magnetic motors 103a/b (not shown) and linear bearing rails 118a/b is equal to the distance A shown in FIG. 5a, in which the center of wafer 40 is located beneath column 10.

Similarly, non-magnetic motors are selected for rotary motors 102a/b (FIG. 2) and the motor driving Z platform 82 (FIG. 4) because of their close proximity to beam 10. The rotary bearing of the rotary table 110 may be made from same material as rails 118a/b. Note that low permeability material are generally not very durable material, and are therefore not ideal for use in components which are subjected to significant mechanical wear and tear.

The impact of the shortcomings of non-magnetic motors 102a/b and 103a/b (e.g., low speed, vibrations, low endurance, and particle generation) and low permeability bearing rails 118a/b and rotary rail on the performance of stage 100 is minimized by engaging the non-magnetic motors only for relatively short periods of time (i.e., the duty cycle of non-magnetic motors 102a/b and 103a/b is several orders of magnitude less than that of magnetic motors 112a/b), and preferably only for positioning the wafer for a subsequent inspection cycle. This is described in more detail below.

Stage 100 can perform such tasks as wafer and optical mask inspections in the well known continuous moving mode or stepping mode. However, the benefits of stage 100 are more fully realized when used in the continuous moving mode. When operating in the continuous moving mode, the wafer is inspected while fast stage 107 is moving. In stepping mode, the system waits for stage 100 to move to and settle at the desired location before inspection starts.

Figure 6:
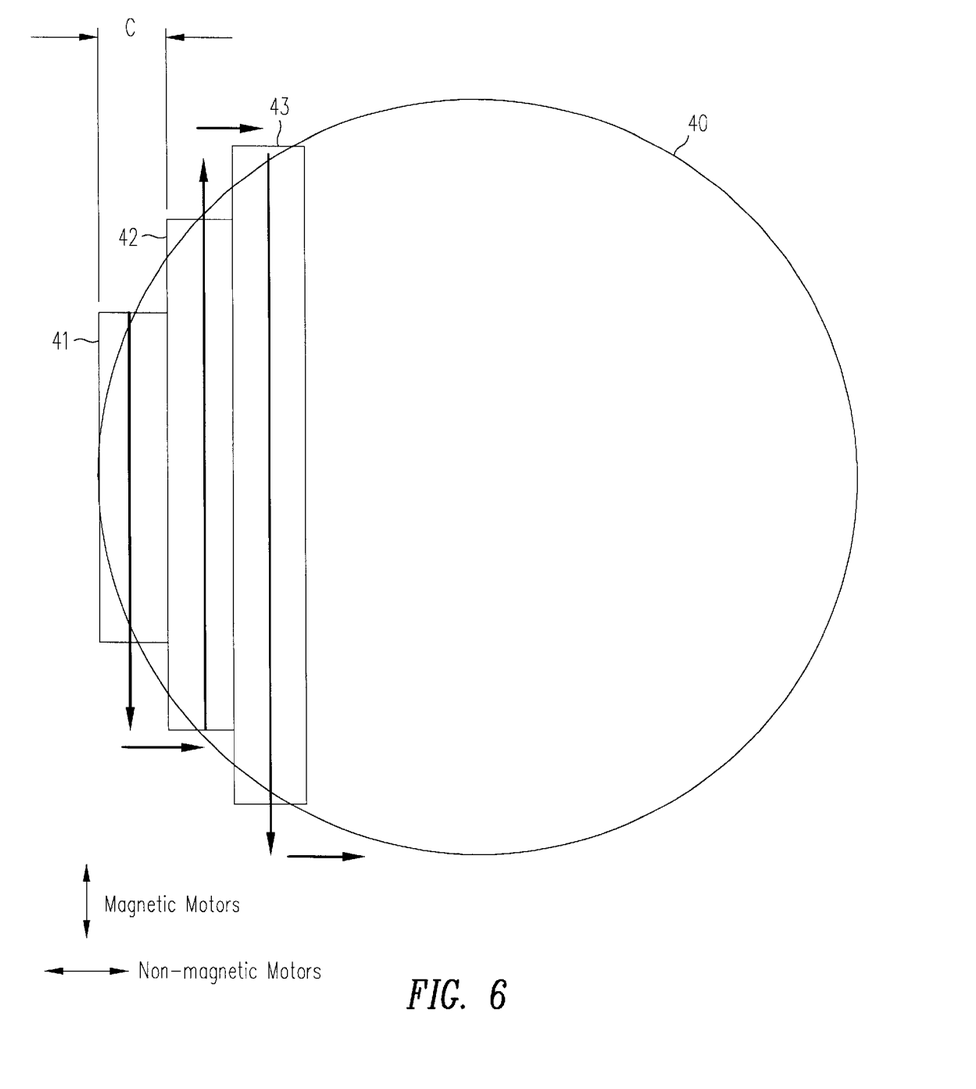
FIG. 6 is a top view of a wafer and illustrates a specific movement pattern for coverage of a wafer, as well as the direction of motion of each of the magnetic and non-magnetic motors.

FIG. 6 is a top view of a wafer 40, and illustrates a specific movement pattern for coverage of a wafer (e.g., wafer inspection) when operating in continuous moving mode. As shown, wafer 40 is inspected along vertical strips (three strips 41, 42, and 43 are shown), each strip having a width indicated as C defined by the field of view of the charged particle microscope. Short horizontal movements bring each strip within the field of view of the microscope. As indicated in FIG. 6, the vertical movements are carried out by magnetic motor driven fast platform 107, and the short horizontal movements are carried out by non-magnetic motor driven slow platform 109.

Each of the short horizontal movements by the slow platform 109 is typically in the range of 10 $\mu$m to 100 $\mu$m, while each of the vertical movements by the fast platform 107 is typically in the range of 10 cm to 100 cm. Thus, the duty cycle of non-magnetic motors 103a/b is three to five orders of magnitude less than the magnetic motors 112a/b.

The high speed of fast platform 107 allows quick inspection of patterns in each strip. Once an entire strip is inspected, slow platform 109 moves the next strip to within the microscope's field of view. This results in the duty cycle of non-magnetic motors 103a/b being significantly less than that of magnetic motors 112a/b, and thus minimizes the adverse effects of non-magnetic motors 103a/b and rails 118a/b on the performance of stage 100. Further, non-magnetic motors 103a/b are in operation only during non-inspection periods (i.e., only to position the wafer for next inspection cycle), and thus any vibrations by motors 103a/b do not adversely impact the inspection.

Note that because of the high duty cycle of magnetic motors 112a/b, rails 117a/b preferably have the following characteristics: (i) mirror finished surfaces to minimize vibrations, (ii) hard surfaces to minimize wear and tear at the point of contact, and (iii) made from strong material resistant to deforming or breaking. Also, the long distance between rails 117a/b and the optics column 10 enables use of stronger and more durable material for rails 117a/b, even though such material may possess poor magnetic characteristics. In one embodiment, rails 117a/b are from hardened steel. Other material such as ceramic or steel alloys may also be used, but they generally are more costly and would require more maintenance.

Stage 100 may also be used in a wafer or optical mask inspection system which performs inspections by comparing two dies (e.g., a target die and a reference die) on a reticle or wafer. Typically, due to the large amount of data generated in such inspections and the system constraints (e.g., limited memory space), the two dies are divided into smaller sections and are inspected one section at a time. This requires frequent traveling between the two dies. To minimize the duty cycle of non-magnetic motors 102a/b and 103a/b and maximize the duty cycle of magnetic motors 112a/b, inspection of the two dies is carried out as illustrated in FIGS. 7a, 7b, and 8.

Figure 7A:
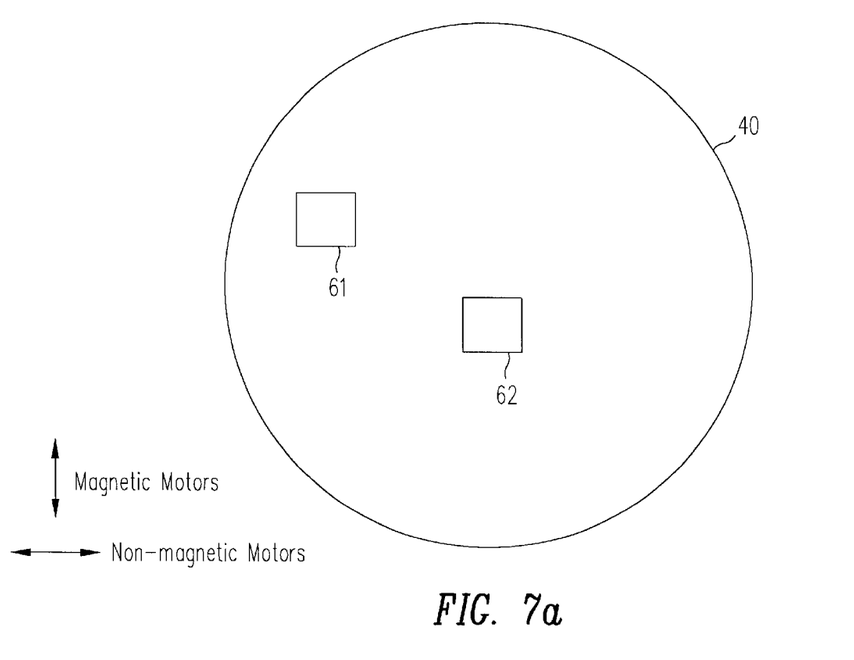
Figure 7B:
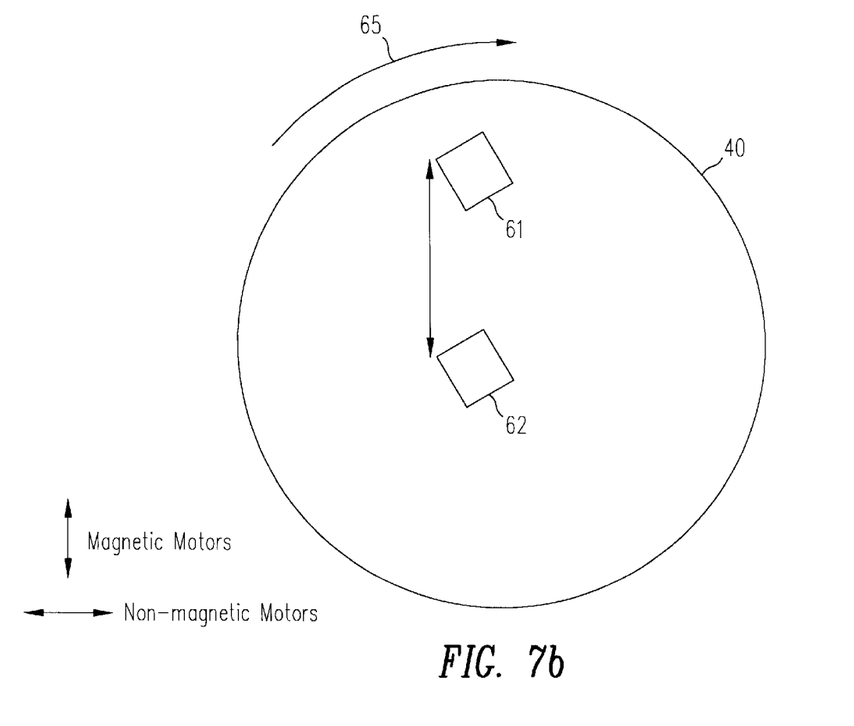
FIG. 7b shows the wafer of FIG. 7a to be rotated so that the two dies are vertically aligned.
Figure 8:
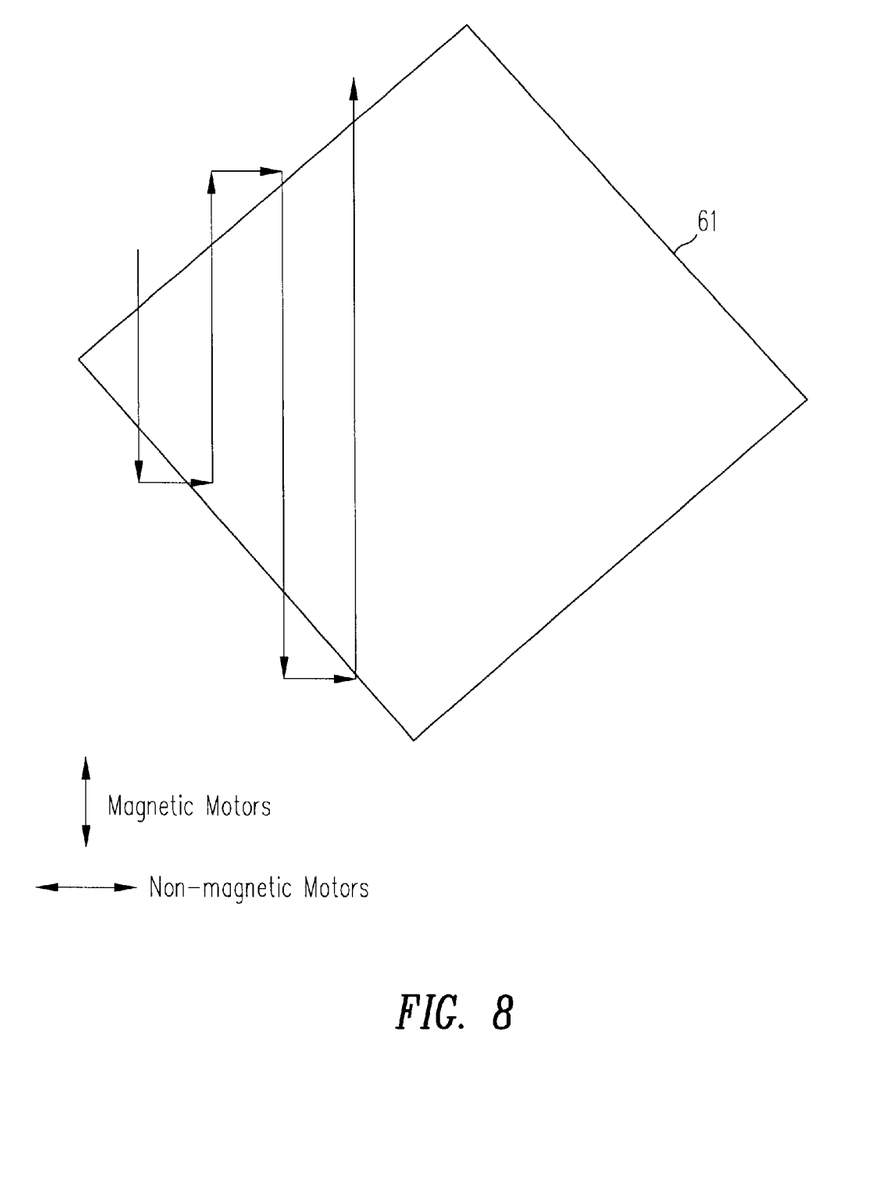
FIG. 8 shows the movement pattern for coverage of one of the dies in FIG. 7b as well as the direction of motion of each of the magnetic and non-magnetic motors.

In FIGS. 7a and 7b a wafer 40 includes a die 61 to be inspected and a reference die 62. Dies 61 and 62 are divided into identical sections (not shown). The system acquires and stores data from a first section of die 61, moves to die 62 and acquires data from the corresponding section of die 62, and then compares the two sets of data for any discrepancies. After the comparison, the data in the system memory is over-written with new data acquired from the next section of die 62; data from the corresponding section of die 61 is then acquired; and another comparison of the two sets of data is then carried out. The remaining sections of dies 61 and 62 are inspected and compared similarly.

As can be seen, this inspection method requires frequent traveling between dies 61 and 62. In order to use the high speed magnetic motors 112a/b for the travels between dies 61 and 62, wafer 40 is rotated such that dies 61 and 62 are vertically aligned and are parallel with the motion of the magnetic motor driven fast platform 107, as shown in FIG. 7b. The wafer rotation, indicated by arrow 65, can be performed by non-magnetic rotary motors 102a/b.

The movement pattern shown in FIG. 6 is used for inspection of each section of dies 61 and 62. This is illustrate in FIG. 8 wherein only die 61 of FIG. 7b is enlarged for clarity. The arrows indicate the pattern of movement and the motors used for each motion. Thus, the rotation scheme of FIG. 7b and the motion pattern of FIG. 8 maximize the duty cycle of the fast and more durable magnetic motors 112a/b, and minimize the duty cycle of the slower and less durable non-magnetic motors 103a/b and 102a/b.

Note that any static or moving parts of the stage that are in or come in close proximity to the electron beam and the optical lens must be of low permeability material and not magnetized. For example, platforms 107 and 109, rotary table 110 in FIG. 2, and Z platform 82 in FIG. 4 can be of such low permeability material as aluminum, ceramic, phosphor bronze, or certain types of stainless steel. In one embodiment, these parts of stage 100 are aluminum due to aluminum's lighter weight and lower cost.

Stage 100 is made vacuum compatible by using vacuum compatible motors as mentioned above, and by not using air bearing for the base 113 or between platform 107 and base 113.

Figure 9:
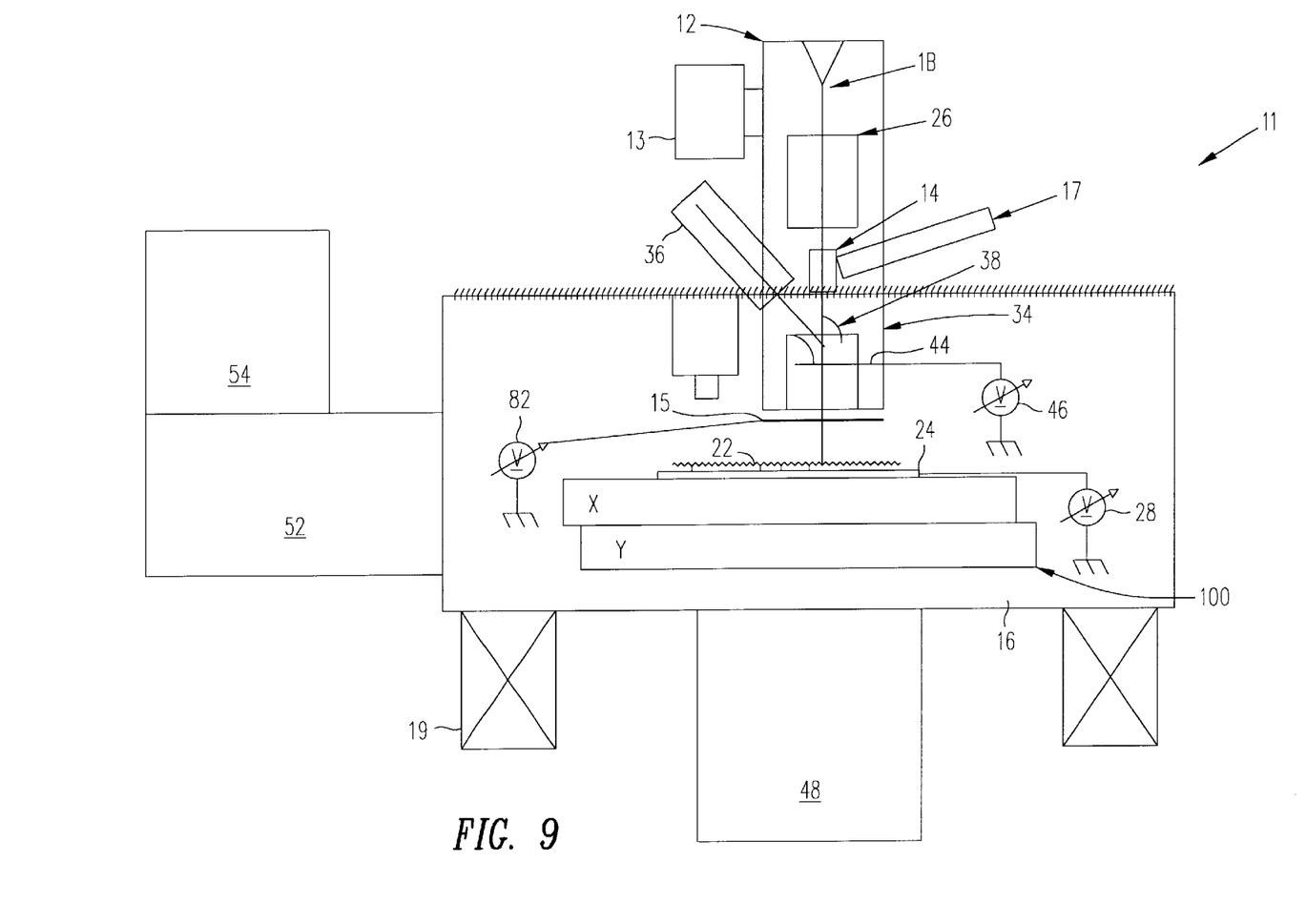
FIG. 9 illustrates one possible application of the stage of FIGS. 2 and 3.

FIG. 9 shows a simplified charged particle microscopy system 11 suitable for inspection of patterned semiconductor wafers. FIG. 9 is provided to illustrate one possible application of stage 100 of FIGS. 2 and 3.

System 11 includes an electron-optical column 12, stage 100, and a vacuum-chamber 16. Electron-optical column 12 has an electron beam source 18 such as a Thermal Field Emission (TFE) electron gun of the type used in most modern scanning electron microscopes (SEMs), for example with a zirconium-tungsten cathode. The electron gun is pumped directly by an ion pump 13. High vacuum in the electron gun is separated from the rest of column 12 and chamber 16 by a differential pumping aperture (not shown), as in most modern SEMs. The primary beam landing energy is adjustable, for example in the range from 500 eV to 1.5 keV. Beam current at a wafer 22 mounted on a wafer chuck 24 is adjustable, such as with an electron beam condenser lens 26 and a beam limiting aperture (not shown), for example in the range from ~500 pA to ~10 nA, or even up to 25–50 nA into a spot size of <0.1 μm. Electron-optical column 12 together with wafer chuck 24 having a bias source 28, and a charge control plate 15 having a bias source 32, are a Local Charge Control Module (LCCM).

Electron-optical column 12 includes a large field of view (FOV) electron beam objective lens 34, such as the known Variable Axis Immersion Lens (VAIL). Objective lens 34 can be a VAIL lens similar to that used in the commercially available Schlumberger ATE IDS 5000 and IDS 10000 E-beam probing systems. For example, the lens is a magnetic-immersion type where the wafer is held in a "magnetic bottle" and allows for collimation and efficient collection of secondary electrons without the need to apply a strong electrostatic collection field. A strong electrostatic collection field is undesirable, as it may cause unstable surface charging and can preclude independent optimization of the wafer bias, extraction potential and energy filter to enhance voltage contrast. Lens 34 can be equipped with both pre-deflection and deflection coils (not shown) to achieve a large FOV (such as 0.25 mm to 1.5 mm across) with high resolution (such as 30–100 nm). In one embodiment, a FOV of 0.25–1.5 mm across has been demonstrated with resolution of <50 nm.

Objective lens 34 is equipped with an "in-the-lens" electron flood gun 36 and a flood beam bending electrode 38 that allows fast multiplexing between a broad, high-current electron flood beam for pre-charging wafer 22 and its conductors and a low voltage, high resolution primary imaging beam for fast imaging to interrogate the charge states of the wafer's conductors. A low voltage primary imaging beam is preferred, because it will not damage wafer 22. In addition, controllable charging can be achieved with a low voltage beam. Fast imaging is performed, for example, at a pixel acquisition rate of 1 MHz to 100 MHz. A suitable flood gun is described in copending U.S. patent applications Ser. No. 08/782,740 filed Jan. 13, 1997, now abandoned, and Ser. No. 09/012,227 filed Jan. 23, 1998, now U.S. Pat. No. 6,091,249. Flood gun 36 in combination with wafer chuck 24 and charge control plate 15 and their respective bias sources 28 and 32 are a Global Charge Control Module (GCCM). In the alternative, the primary beam is used both to pre-charge the wafer's conductors and to image the wafer.

Secondary electrons are generated at the surface of wafer 22 by raster-scanning the primary beam over the surface. These secondary electrons are collected by the lens field, travel back through the bore of lens 26, and are separated from the primary electron beam by a conventional Wien filter 14, which has crossed magnetic and electric fields. The secondary electrons are then detected by an electron detector 17, such as a scintillator-PMT combination, also known as an Evahart-Thornley detector. Other detector combinations may also be used. Provision is advantageously made to shield electron detector 17 against damage or rapid aging from the strong secondary electron current generated when the flood beam is in use. Detector 17 supplies a signal which can be used to form an image of the scanned region of the work-piece.

In FIG. 9, provision is made to apply independent bias voltages to charge control plate 15 from bias source 32 and to wafer chuck 24 from bias source 28. The bias voltage applied to wafer chuck 24 is effectively applied to the substrate of wafer 22. These bias voltages can be independently set, under computer control if desired, to optimize voltage contrast depending on the type of wafer being imaged and the type of defect to be detected.

The bore of lens 34 is equipped with a planar filter electrode 44, also called an energy filter mesh, having a bias voltage source 46. Electrode 44 serves as a retarding field electron energy spectrometer, as in the above-mentioned Schlumberger IDS 5000 and IDS 10000 systems. The energy filter can be used to optimize voltage contrast for certain wafer types by collecting secondary electrons with a specific retarding potential or energy range, for example in the range from zero to ~15 eV energy off the wafer.

Stage 100 is equipped to handle, e.g., wafers up to 300 mm in diameter, allowing inspection of the entire upper surface of the wafer. Wafer 22 is supported on wafer chuck 24 such as a conventional electrostatic-type chuck. Stage 100 is capable of high-speed operation as well as precise scanning and stepping operation to enable detection of the widest possible range of defects. For example, the stage may have a settling time of <0.3 s, a linear speed of 100 mm/s, and a laser-interferometer feedback for detecting positional accuracy within ~0.1 $\mu$m.

Vacuum chamber 16 of system 11 is vacuum pumped directly by a turbo pump 48 and an oil-free backing pump (not shown). Vacuum chamber 16 is mounted on an active vibration isolation platform 19 which cancels environmental vibration and also predictively cancels motion due to fast acceleration and deceleration of stage 100. A conventional wafer loadlock subsystem 52 is included to minimize wafer change over time and to allow the main vacuum chamber to stay at a high vacuum, such as 1E-6 Torr for long periods. Maintaining vacuum 16 also minimizes hydrocarbon contamination of the wafer. Wafer loadlock subsystem 52 conventionally includes wafer handling robots for automatic loading and unloading of wafers from a wafer cassette 54.

A compact, durable, and vacuum compatible stage in accordance with the present invention has minimal mechanical vibrations, minimal interference with the beam and optical lens, minimal particle generation, and high speed area coverage.

The present stage is generally applicable to charged particle microscopy and other imaging systems, and also to such systems as wafer and optical mask inspection and lithography systems, critical dimension measurement systems, and waveform measurement systems. This disclosure therefore is illustrative and not limiting and further modifications will be apparent to one skilled in the art and are intended to fall within the scope of the appended claims.

What is claimed is:

1. A stage assembly comprising:
   a stage for holding a work-piece, the stage including a first platform and a second platform;
   a magnetic motor coupled to the first platform to drive the first platform along a first axis; and
   a non-magnetic motor coupled to the second platform to drive the second platform along a second axis.

2. The stage assembly of claim 1 wherein during stage movement, an operational duty cycle of the magnetic motor is substantially greater than an operational duty cycle of the non-magnetic motor.

3. The stage assembly of claim 2 wherein a constant distance is maintained between the magnetic motor and a microscope located to observe the work-piece.

4. The stage assembly of claim 2 wherein the first axis is perpendicular to the second axis.

5. The stage assembly of claim 2 wherein the magnetic motor is a vacuum compatible linear servo motor and the non-magnetic motor is a vacuum compatible linear piezoelectric motor.

6. The stage assembly of claim 2 wherein during its operational duty cycle the non-magnetic motor moves the stage for non-inspection functions.

7. The stage assembly of claim 2 further comprising a non-magnetic rotary motor coupled to the stage to rotate stage in a plane defined by the first and second axes, wherein an operational duty cycle of the magnetic motor is substantially greater than an operational duty cycle of the non-magnetic rotary motor.

8. The stage assembly of claim 7 wherein the stage, the magnetic motor, the non-magnetic motor for driving the second platform along the second axis, and the non-magnetic rotary motor are housed in a vacuum enclosure.

9. The stage assembly of claim 2 wherein the first platform is movable on a base along the first axis the second platform is movable on the first platform along the second axis.

10. The stage assembly of claim 9 wherein the non-magnetic motor is fixed to the first platform and is enclosed by the first and second platforms.

11. The stage assembly of claim 9 further comprising a rotary table capable of rotating on the second platform.

12. The stage assembly of claim 11 wherein the rotary table is coupled to and rotated by a non-magnetic motor.

13. The stage assembly of claim 12 wherein the non-magnetic motor coupled to the rotary table is a vacuum compatible piezoelectric motor.

14. The stage assembly of claim 11 wherein the rotary table is adapted to carry the work-piece which is a semiconductor wafer.

15. The stage assembly of claim 11 wherein the first platform, the second platform, and the rotary table are at least partly comprised of aluminum.

16. The stage assembly of claim 11 further comprising:
   a first linear bearing rail on which the first platform rides to move on the base;
   a second linear bearing rail on which the second platform rides to move on the first platform; and
   a rotary bearing on which the rotary table rides to rotate on the second platform.

17. The stage assembly of claim 16 wherein the second linear bearing rail and rotary bearing are comprised of low permeability non-magnetic material.

18. The stage assembly of claim 16 wherein each of the second linear bearing rail and rotary bearing are comprised of hardened beryllium copper, or phosphor bronze, or ceramic.

19. The stage assembly of claim 16 wherein the first linear bearing rail is comprised of hardened steel.

20. The stage assembly of claim 16 wherein the first and second linear bearing rails and the rotary bearing each include a mirror finished hardened surface.

21. The stage assembly of claim 16 wherein a constant distance is maintained between the first linear bearing rail and a microscope located to observe the work-piece.

22. The stage assembly of claim 9 further comprising a microscope fixed to the base and located to observe the work-piece.

23. The stage assembly of claim 22 wherein the magnetic motor includes a magnet track assembly which is stationary relative to the microscope.

24. The stage assembly of claim 22 wherein a magnet track assembly is fixed to the base.

25. The stage assembly of claim 24 wherein the magnet track assembly defines an opening for receiving a coil assembly, the opening facing away from the microscope.

26. The stage assembly of claim 25 wherein the coil assembly is fixed to the first platform.

27. The stage assembly of claim 22 wherein during its operational duty cycle the non-magnetic motor moves the stage to bring an area of the work-piece to within a field of view of the microscope.

28. The stage assembly of claim 2 further comprising a non-magnetic motor coupled to the stage to drive the stage along a third axis, the third axis being perpendicular to the first and second axes.

29. The stage assembly of claim 28 wherein the non-magnetic motor for driving the stage along the third axis is a piezoelectric motor.

30. The stage assembly of claim 29 wherein the non-magnetic motor for driving the stage along the third axis adjusts a distance between the work-piece and a microscope to observe the work-piece.

31. A stage assembly comprising:
a stage for holding a work-piece, the stage including a first platform and a second platform, the second platform being carried by the first platform and movable with respect to the first platform;
a microscope coupled to the stage for viewing the work-piece; and
a magnetic motor coupled to the first platform, the magnetic motor driving the first platform along a first axis to move the stage during inspection of an area of the work-piece; and
a non-magnetic motor coupled to the second platform, the non-magnetic motor driving the second platform along a second axis to position an area of the work-piece under the microscope.

32. The stage assembly of claim 31 wherein during movement of the stage, an operational duty cycle of the magnetic motor is substantially greater than an operational duty cycle of the non-magnetic motor.

33. The stage assembly of claim 32 wherein the work-piece is inspected along a linear area of its surface, the non-magnetic motor moving the stage to position a first portion of the linear area under the microscope, and the magnetic motor moving the stage during inspection of the linear area.

34. The stage assembly of claim 33 wherein a width of the linear area is defined by a field of view of the microscope.

35. The stage assembly of claim 32 wherein the work-piece is rotated so that two areas of the work-piece are aligned along a line parallel to an axis along which the magnetic motor moves the stage, and corresponding sub-areas in the two areas are then compared to one another.

36. The stage assembly of claim 35 wherein the work-piece is rotated by a non-magnetic rotary motor coupled to the stage, an operational duty cycle of the magnetic motor being substantially greater than an operational duty cycle of the non-magnetic rotary motor.

37. The stage assembly of claim 31 wherein the magnetic motor is a linear servo motor and the non-magnetic motor is a linear piezoelectric motor.

38. A method for operating a stage for a holding a work-piece, the stage including a first platform and a second platform, comprising:
driving the first platform of the stage along a first axis by a magnetic motor; and
driving the second platform of the stage along a second axis by a non-magnetic motor,
wherein the second platform is carried by the first platform, and driving the first platform includes moving the second platform along the first axis.

39. The method of claim 38 wherein an operational duty cycle of the magnetic motor is substantially greater than an operational duty cycle of the non-magnetic motor.

40. The method of claim 39 further comprising:
locating the work-piece on the stage under a microscope;
moving an area of the work-piece to be inspected to within a field of view of the microscope during the duty cycle of the non-magnetic motor; and
inspecting the area of the work-piece during the duty cycle of the magnetic motor.

41. The method of claim 40 wherein the area is a linear area, a width of the linear area being defined by the field of view of the microscope.

42. The method of claim 39 further comprising:
locating the work-piece on the stage under a microscope;
rotating the work-piece so that two areas of the work-piece are aligned along a line parallel to the first axis; and
comparing corresponding sub-areas in the two areas to one another.

43. The method of claim 42 wherein the comparing act comprises the acts of:
acquiring a first data from a sub-area of a first area;
moving to a corresponding sub-area of a second area during the duty cycle of the magnetic motor;
acquiring a second data from the sub-area of the second area; and
comparing the first and second data.

44. The method of claim 43 wherein the acquiring act comprise the acts of:
moving a strip of a sub-area to within a field of view of the microscope during the duty cycle of the non-magnetic motor; and
acquiring data from the strip during the duty cycle of the magnetic motor,
wherein a width of the strip is defined by the field of view of the microscope.

45. The method of claim 42 wherein the rotating act is performed by a non-magnetic rotary motor, an operational duty cycle of the magnetic motor being substantially greater than an operational duty cycle of the non-magnetic rotary motor.

46. The method of claim 38, wherein the magnetic motor is a vacuum compatible linear servo motor.

* * * * *